United States Patent
Pekurovsky et al.

(10) Patent No.: US 9,556,510 B2
(45) Date of Patent: Jan. 31, 2017

(54) PRINTING OF MULTIPLE INKS TO ACHIEVE PRECISION REGISTRATION DURING SUBSEQUENT PROCESSING

(71) Applicant: 3M INNOVATIVE PROPERTIES COMPANY, St. Paul, MN (US)

(72) Inventors: Mikhail L. Pekurovsky, Bloomington, MN (US); Ann M. Gilman, Woodbury, MN (US); Daniel J. Theis, Mahtomedi, MN (US)

(73) Assignee: 3M INNOVATIVE PROPERTIES COMPANY, St. Paul, MN (US)

( * ) Notice: Subject to any disclaimer, the term of this patent is extended or adjusted under 35 U.S.C. 154(b) by 0 days.

(21) Appl. No.: 15/076,236

(22) Filed: Mar. 21, 2016

(65) Prior Publication Data

US 2016/0200095 A1    Jul. 14, 2016

Related U.S. Application Data

(62) Division of application No. 14/650,343, filed as application No. PCT/US2013/074231 on Dec. 11, 2013, now Pat. No. 9,322,093.

(Continued)

(51) Int. Cl.
*H05K 3/16*    (2006.01)
*C23C 14/34*    (2006.01)
(Continued)

(52) U.S. Cl.
CPC ............. *C23C 14/34* (2013.01); *B05D 1/28* (2013.01); *B05D 3/007* (2013.01); *B05D 3/067* (2013.01);
(Continued)

(58) Field of Classification Search
CPC .......... B41F 9/02; B41F 9/023; B41F 9/1063; B41F 9/063; B41F 3/42; B41F 5/16; B41F 15/10; B41F 33/0081; H05K 2203/166; H05K 2203/1333; H05K 2203/1338; H05K 3/0008; H05K 3/4679; H05K 3/146; H05K 3/16; H05K 13/0015; H05K 2201/09918; H05K 1/0269; C23C 14/34; B41M 3/008
See application file for complete search history.

(56) References Cited

U.S. PATENT DOCUMENTS 4,895,631 A    1/1990    Wirz et al.
5,440,446 A    8/1995    Shaw et al.
(Continued)

FOREIGN PATENT DOCUMENTS

CN            102822985 A     12/2012
WO    WO 2013/003412         1/2013
(Continued)

*Primary Examiner* — Blake A Tankersley
(74) *Attorney, Agent, or Firm* — James A. Baker

(57) ABSTRACT

A method of achieving precision registration in a roll to roll process by simultaneously depositing multiple inks onto a printing roll. One of these inks prints a pattern of fiducial marks onto a substrate while another ink prints a predetermined pattern on the same substrate such that the predetermined pattern bears a predictable spatial relationship to the pattern of fiducial marks. Consequently, even if the ink forming the predetermined pattern is invisible, or has such low contrast with the substrate that it is effectively invisible, or even has been dissolved away in a subsequent processing step, it is still possible to know where the predetermined pattern is by referring to the pattern of fiducial marks.

4 Claims, 3 Drawing Sheets

Related U.S. Application Data

(60) Provisional application No. 61/739,992, filed on Dec. 20, 2012.

(51) Int. Cl.
| | |
|---|---|
| *B41F 33/00* | (2006.01) |
| *B05D 1/28* | (2006.01) |
| *B05D 3/06* | (2006.01) |
| *B05D 3/00* | (2006.01) |
| *B41F 3/00* | (2006.01) |
| *H05K 13/00* | (2006.01) |
| *B41F 9/10* | (2006.01) |
| *B41M 3/00* | (2006.01) |
| *B41F 31/00* | (2006.01) |
| *B41F 31/02* | (2006.01) |
| *B41F 31/04* | (2006.01) |
| *H05K 1/02* | (2006.01) |
| *H05K 3/12* | (2006.01) |
| *H05K 3/46* | (2006.01) |
| *H05K 1/03* | (2006.01) |
| *H05K 3/24* | (2006.01) |

(52) U.S. Cl.
CPC .............. *B41F 3/00* (2013.01); *B41F 9/1063* (2013.01); *B41F 31/008* (2013.01); *B41F 31/02* (2013.01); *B41F 31/04* (2013.01); *B41F 33/0081* (2013.01); *B41M 3/008* (2013.01); *H05K 1/0269* (2013.01); *H05K 3/1275* (2013.01); *H05K 13/0015* (2013.01); *H05K 1/0283* (2013.01); *H05K 1/0393* (2013.01); *H05K 3/16* (2013.01); *H05K 3/246* (2013.01); *H05K 3/4679* (2013.01); *H05K 2201/09918* (2013.01); *H05K 2203/0143* (2013.01); *H05K 2203/1344* (2013.01); *H05K 2203/1545* (2013.01); *H05K 2203/166* (2013.01)

(56) References Cited

U.S. PATENT DOCUMENTS

| | | |
|---|---|---|
| 7,018,713 B2 | 3/2006 | Padiyath et al. |
| 2003/0154871 A1 | 8/2003 | Laksin et al. |
| 2004/0131779 A1 | 7/2004 | Haubrich et al. |
| 2007/0153223 A1 | 7/2007 | Jang et al. |
| 2008/0092377 A1 | 4/2008 | Heitzinger |
| 2010/0015329 A1 | 1/2010 | Nguyen |
| 2010/0097462 A1 | 4/2010 | Carlson |
| 2010/0165343 A1* | 7/2010 | Takeda ............... B41F 33/0081 356/364 |
| 2010/0188668 A1 | 7/2010 | Carlson et al. |
| 2010/0196607 A1 | 8/2010 | Carlson et al. |
| 2010/0224604 A1 | 9/2010 | Budde et al. |
| 2011/0100957 A1 | 5/2011 | Moran |
| 2011/0257779 A1 | 10/2011 | Theis et al. |

FOREIGN PATENT DOCUMENTS

| | | |
|---|---|---|
| WO | WO 2013/040319 | 3/2013 |
| WO | WO 2013/090134 | 6/2013 |

* cited by examiner

PRINTING OF MULTIPLE INKS TO ACHIEVE PRECISION REGISTRATION DURING SUBSEQUENT PROCESSING

BACKGROUND

The fabrication of articles such as flexible electronic or optical components, can involve the application of layers of material deposited or formed on an elongated substrate or web. In particular, patterns of material may be deposited in layers on an elongated substrate, such as a web, through multiple deposition steps. Some articles require precise registration of features that are applied on one or both sides of the substrate.

To achieve accurate registration between the layers, lateral (cross web) positioning and longitudinal (down web) positioning must be maintained as the substrate moves through multiple manufacturing steps. Maintaining registration between layers formed on the substrate becomes more complex when the substrate is flexible or stretchable. Some articles are made in multiple steps during which materials or processes are sequentially applied to the substrate, requiring precise position registration for each of the process steps.

SUMMARY

Disclosed is a method of achieving precision registration in a roll to roll process by simultaneously depositing multiple inks onto a printing roll. One of these inks prints a pattern of fiducial marks onto a substrate while another ink prints a predetermined pattern on the same substrate such that the predetermined pattern bears a predictable spatial relationship to the pattern of fiducial marks. Consequently, even if the ink forming the predetermined pattern is invisible, or has such low contrast with the substrate that it effectively invisible, or even has been dissolved away in a subsequent processing step, it is still possible to know where the predetermined pattern is by referring to the pattern of fiducial marks. In some convenient embodiments, the predetermined pattern will define conductive circuit traces after secondary operations. In some other convenient embodiments, the predetermined pattern will define at least one aspect of a tamper-resistant security mark.

Embodiments where the predetermined pattern is printed in a soluble ink are of particular interest. For example, it is possible to sputter a layer of conductive material onto the printed substrate and then rinse the substrate so as to remove the soluble ink. This also removes the sputtered layer above the soluble ink. If the fiducial marks are not soluble in the solvent, the location of the pattern in the sputtered layer can be known, even if that pattern is invisible, or has such low contrast with the substrate that it is effectively invisible.

In one embodiment, the invention resides a method of providing a substrate having a predetermined pattern thereon comprising: providing a printing roll, a first ink dispenser, and a second ink dispenser; the first ink dispenser and the second ink dispenser positioned to dispense a first ink and a second ink onto the printing roll in separate first and second zones respectively; dispensing the first ink soluble in a selected solvent into the first zone with the first ink dispenser and dispensing the second ink that is non-soluble in the selected solvent into the second zone with the second ink dispenser; advancing the substrate against the printing roll printing fiducial marks onto the substrate with the second ink, while simultaneously printing the predetermined pattern onto the substrate with the first ink; sputtering a layer of conductive material onto the substrate over the predetermined pattern; and rinsing the substrate with the selected solvent removing the first ink and the predetermined pattern while leaving the fiducial marks on the substrate.

In another embodiment, the invention resides in a method of providing a substrate having a predetermined pattern thereon comprising: providing a printing roll, a first ink dispenser, and a second ink dispenser, the first ink dispenser and the second ink dispenser positioned to dispense a first and a second ink onto the printing roll in separate first and second zones respectively; dispensing a low contrast ink into the first zone and a visible ink into the second zone; advancing the substrate against the printing roll to print fiducial marks onto the substrate with the visible ink, while simultaneously printing a first predetermined pattern onto the substrate with the low-contrast ink; subsequently placing a secondary pattern in registration with the first predetermined pattern on the substrate using the fiducial marks as a guide. In some convenient embodiments, the secondary predetermined pattern is placed in registration with the first predetermined pattern by a second printing operation. In another embodiment, the secondary predetermined pattern is placed in registration with the first predetermined pattern by laminating an additional layer to the substrate.

In this application, "contrast" means the degree of dissimilarity of a measured quantity such as luminance of two areas, expressed as a number computed by a specified formula. This definition comes from ASTM Standard E284, "Standard Terminology of Appearance". In the broadest sense a "low contrast ink" is any ink that is insufficiently optically distinguishable from the substrate to allow a secondary operation on the substrate to be directly registered with predetermined pattern. A more formal definition is presented in connection with the optical test discussed in Example 3 below.

In this application, "predetermined pattern" means a pattern that can include lines, repeating lines, traces, symbols, letters, figures, graphics, numbers, or combinations thereof by way of example; that is determined or selected in advance to be placed onto the substrate by suitable replicating methods such as printing. The predetermined pattern can include features having a dimension of less than 20, 10, or 5 microns in size.

In this application "fiducial marks" means a pattern of symbols, lines, points, or other shapes placed onto the substrate for use by an imaging system as a point of reference for obtaining information on web displacement, web speed, or web position.

Those skilled in the art will more fully understand the nature of the invention upon consideration of the remainder of the disclosure, including the Detailed Description, the Examples, and the appended claims.

BRIEF DESCRIPTION OF THE DRAWINGS

It is to be understood by one of ordinary skill in the art that the present discussion is a description of exemplary embodiments only, and is not intended as limiting the broader aspects of the present disclosure, which broader aspects are embodied in the exemplary construction.

Figure 1:
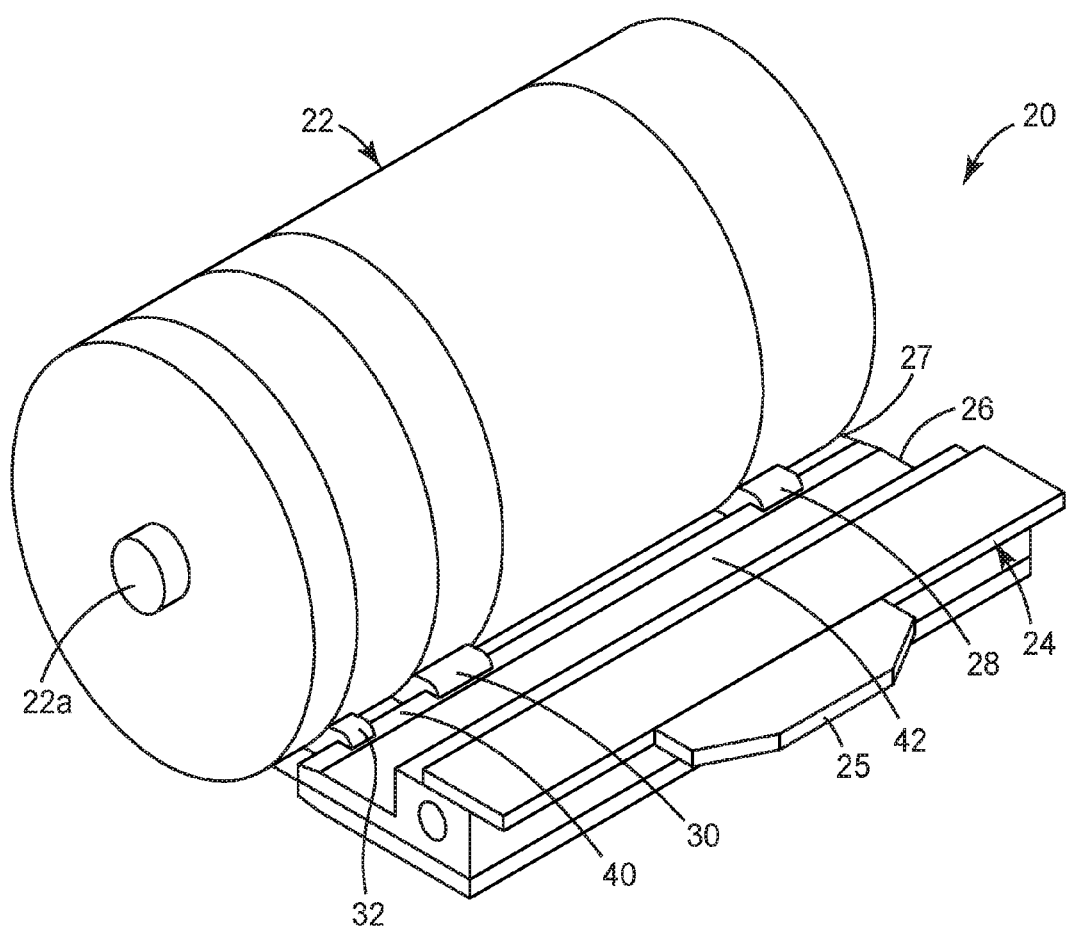
FIG. 1 is a perspective view of a printing apparatus including a printing roll adjacent to a doctor blade assembly divided into zones along its cross web width.

Repeated use of reference characters in the specification and drawings is intended to represent the same or analogous features or elements of the disclosure.

DETAILED DESCRIPTION

Referring now to FIG. 1, a printing apparatus 20 suitable for carrying out the present disclosure is illustrated. The printing apparatus 20 includes a printing roll 22 and a doctor blade assembly 24 adjacent to printing roll 22. In some alternate embodiments roll 22 is a transfer roll such as an anilox roll that inks a separate printing roll indirectly. Printing roll 22 may be either a live shaft roll having a shaft 22a or a dead shaft roll. Printing roll 22 is conveniently an anilox roll, but the invention is workable with, e.g. equipment for flexo printing, gravure printing, screen printing, ink jet printing, and dual offset printing. Doctor blade assembly 24 conveniently includes support 25 and blade support 26. The blade support 26 retains the actual doctor blade 27. The illustrated blade support 26 includes barriers 28, 30, and 32 that divide the cross web width of the blade support 26 into a first zone 42 and a second zone 40. The barriers 28, 30, and 32 are conveniently formed from a soft, resilient material that can seal against the side of printing roll 22 without scratching it.

When the printing roll 22 is a microflexo printing roll, the fabrication methods disclosed in PCT International Pub. No. WO 2013/003412 may be advantageously used. As mentioned there, a micro-contact printing stamp for, e.g. printing electrical circuit predetermined patterns can result in printed traces is less than 20, 10, or even 5 microns. Further, the fiducial marks and the predetermined pattern can be laid down in registration with a dimensional accuracy of less than 20, 10, or even 5 microns. Mounting a microflexo stamp to the printing roll 22 may be advantageously accomplished using the techniques disclosed in PCT International Pub. No. WO 2013/040319.

Figure 2:
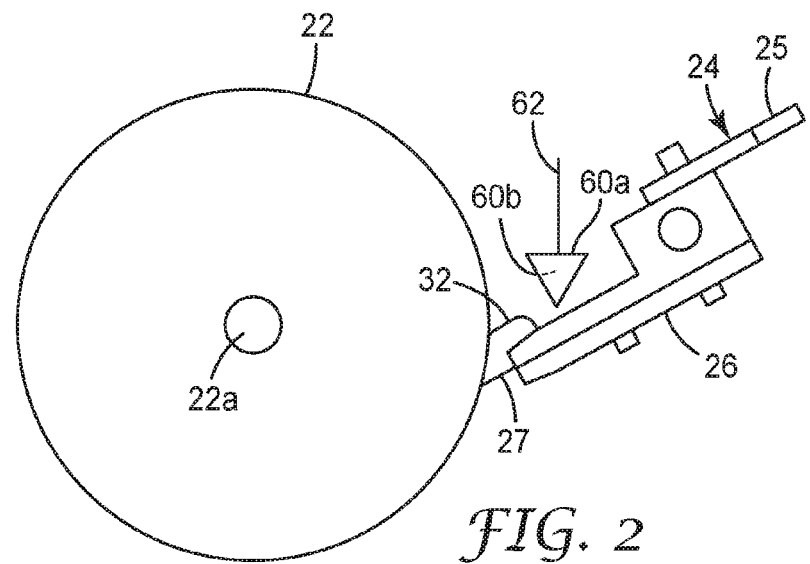
FIG. 2 is a side schematic view of the printing apparatus of FIG. 1.

Referring now to FIG. 2, a side view of the printing apparatus 20 of FIG. 1 is illustrated. In this side view, it can be better appreciated how the doctor blade 27 is supported by blade support 26. Also seen in this view is a first ink dispenser 60a omitted from FIG. 1 for visual clarity. First ink dispenser 60a is connected to a first ink supply 62 for dispensing a first ink into the first zone (42 in FIG. 1) of the blade support 26. In this view, a similar second ink dispenser 60b is disposed behind the first ink dispenser 60a and hidden from view for dispensing a second ink into the second zone (40 in FIG. 1). Depending on user preferences and/or the type of printing being contemplated, the form of the ink dispensers can take numerous forms such as spouts, sprayers, fed brushes, fed rollers, or the like.

Figure 3:
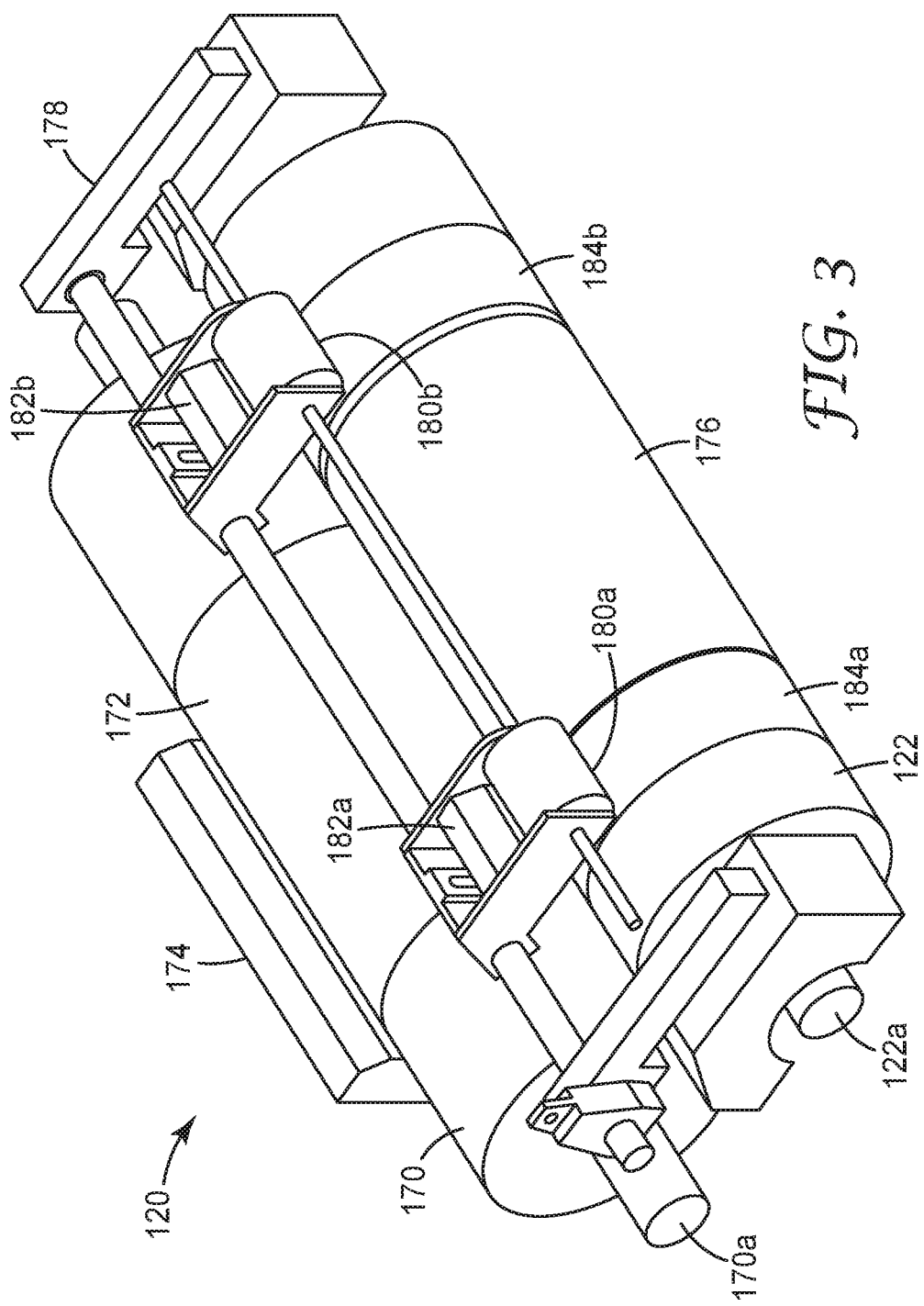
FIG. 3 is a perspective view of an alternate printing apparatus according to one embodiment of the present invention.

Referring now to FIG. 3, an alternative printing apparatus 120 suitable for carrying out the present invention is illustrated. The printing apparatus 120 includes a printing roll 122. Printing roll 122 may be either a live shaft roll having a shaft 122a or a dead shaft roll. Analogous to printing apparatus 20 above, printing roll 122 is conveniently an anilox roll, but the invention is workable with, e.g. equipment for flexographic printing, gravure printing, screen printing, ink jet printing, and dual offset printing. In the illustrated embodiment, the printing roll 122 is adjacent to a main inking roll 170 which is rotatable about shaft 170a. The inking roll 170 is inked with a first ink in a first zone 172 by a main inker 174. The first ink in the first zone 172 is transferred to printing roll 122 in a first receiving zone 176.

A support 178 carries at least one (in this illustrated embodiment, two) subsidiary inking rolls 180a and 180b, each inked with a second ink by secondary inkers 182a and 182b, respectively. The second ink is transferred to printing roll 122 in two second receiving zones 184a and 184b. The substrate, in many convenient embodiments a web of indefinite length material, can then be brought into contact with the printing roll 122 in a conventional manner.

Figure 4:
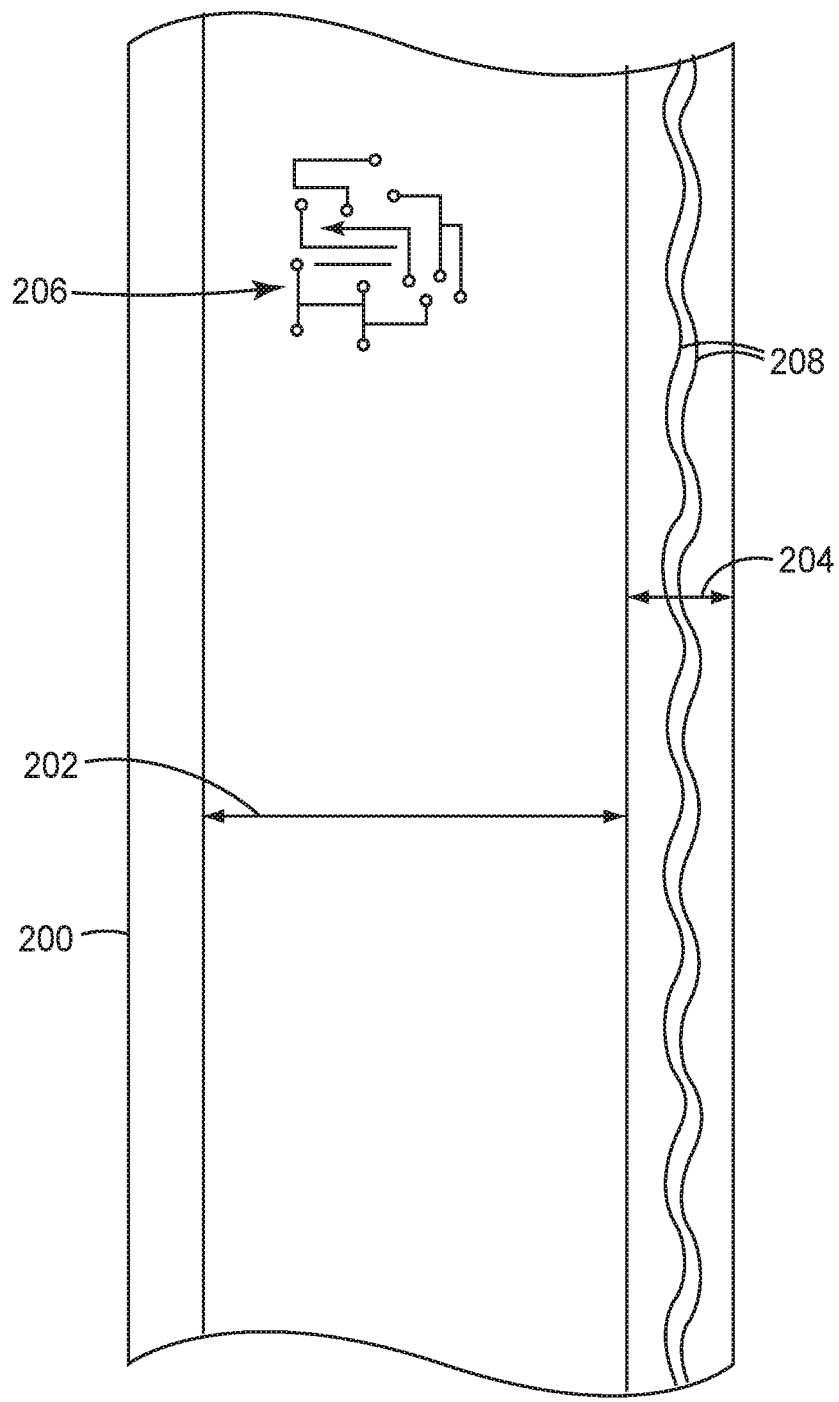
FIG. 4 is a plan view of a web of indefinite length steering that has had a first and second ink printed in first and second zones by an apparatus according the present invention.

Referring now to FIG. 4, illustrated is a plan view of a web 200 of indefinite length that has had a first and second ink printed in first zone 202 and second zone 204 respectively by one of the apparatuses as discussed above. Within first zone 202, a predetermined pattern 206 has been printed (perhaps a security marking in a low-contrast ink or the pattern of an electronic circuit in a soluble ink). A pair of fiducial marks 208 has been printed in second zone 204. In various embodiments, the fiducial marks and the predetermined pattern are in registration with a dimensional accuracy of less than 20, 10, or even 5 microns.

While any pattern of fiducial marks that allows the determination of the position of the predetermined pattern is workable, some possibilities offer distinct advantages. In particular, fiducial marks useful for determining the down web and/or cross web position of a moving web, and methods related to those patterns, can be found in U.S. Patent Application Pub. Nos. 2010/0196607, 2010/0188668, and 2011/0247511. In particular, the fiducial marks illustrated as 208 in FIG. 4 are disclosed in U.S. Patent Application Pub. No. 2011/0257779.

Example 1

A printing apparatus generally as illustrated in FIGS. 1 and 2 was constructed. The printing roll was 12 cm in diameter. The roll had a predetermined pattern of connected diamonds in both the first and the second zones. On a stainless steel doctor blade, three barriers were formed against the roll from vinyl polysiloxane impression material commercially available as 3M ESPE 7302 EXPRESS from 3M Company of St. Paul, Minn.

A water soluble ink as disclosed in U.S. Pat. No. 4,895,631 was dispensed onto the doctor blade in the first zone, while a UV curable, non-water-soluble ink, commercially available as 9301 Opaque white UV flexo ink from Nazdar Ink Technologies of Shawnee, Kans., was dispensed onto the doctor blade in the second zone. After a pause to allow the roll to become inked, printing was begun onto a substrate of conventional polyester terephthalate (PET) film, conveyed at a line speed of 2 m/min and at a tension of 1 pound/linear inch (1.75 N/cm). The web was passed through a UV curing station having a microwave light source commercially available as a Model 1250B from Fusion UV Systems, Inc. of Gaithersburg, Md., connected to a power supply commercially available as Model VPS-48, also from Fusion UV Systems, Inc. This station was set to 40% power and was supplied with 8 SCFM of nitrogen. This caused the second ink to become non-soluble.

Example 2

The film according to Example 1 was passed through a sputter deposition apparatus of conventional type, e.g. a roll-to-roll vacuum chamber similar to the system described in U.S. Pat. No. 5,440,446 (Shaw et al.) and U.S. Pat. No. 7,018,713 (Padiyath, et al.). A 40 nm thick layer of indium tin oxide (ITO) was deposited on the substrate in the first zone. The film is then rinsed in water, causing the water soluble ink to be dissolved away in the first zone, carrying with it the portion of the sputtered layer above the predetermined pattern. The fiducial marks in the second zone printed with the UV curable ink remained on the film after rinsing with water. Predetermined patterns formed in this way can have features with a dimension less than 20 mils (0.5 mm).

Example 3

An apparatus generally as depicted in FIG. 3 was constructed. A first ink, commercially available as 9301 Opaque white UV flexo ink from Nazdar Ink Technologies was dispensed from the first inker onto a microflexo printing roll in the first zone. The microflexo printing roll had a predetermined pattern of spaced apart rectangles in the first zone. A second ink, commercially available as 9319 Base Process Blue UV flexo ink from Nazdar Ink Technologies, was dispensed from the second inker onto the microflexo printing roll in the second zone. The microflexo printing roll had a predetermined pattern of spaced apart rectangles in the second zone. These inks were printed from the anilox roll onto a substrate of white paper coated with a silicone release liner and then over coated with a thin layer of a pressure sensitive adhesive, specifically a random copolymer of 90% by weight of iso-octyl acrylate and 10% by weight of acrylic acid. After the printing, the web was passed through a UV curing station having a microwave light source commercially available as a Model 1250B from Fusion UV Systems, Inc., connected to a power supply commercially available as Model VPS-48, also from Fusion UV Systems, Inc. This station was set to 40% power and was supplied with 8 SCFM of nitrogen. This particular film and ink composition is simulative of certain security mark applications; and, after the inks were dried, the pattern within the first zone was nearly invisible to the naked eye in normal room illumination. However the ink in the second zone was sharp and plainly visible.

This low-contrast between the inked area and the substrate within zone 1 was assessed by measuring the reflectance of adjacent inked and uninked areas using a MICROMAX photometric camera commercially available from Princeton Instruments of Trenton, N.J. Data was collected at maximum angular apertures of 8.6, 17.5, and 30.0 degrees and under conditions where the cone of illumination was equal to the cone of collection. The results are presented in Table 1 and each entry represents the mean of five experiments in different random portions of the inked substrate. $R_s$ is the reflectance of the substrate in arbitrary units. $R_i$ is the reflectance of the inked area in arbitrary units. Three values were calculated from these values: $C_c$ is $R_s/R_i$, $C_a=(R_s-R_i)/R_i$, and $C_b=(R_s-R_i)/((R_s+R_2)/2)$.

One definition of "low-contrast ink" may be stated as one where the $C_c$ value calculated when the $R_s$ and $R_i$ values are measured at a 30.0° aperture with the cone of illumination equal to the cone of collection is between about 0.9 and 1.1.

Example 4

The printed web of Example 3 was conveyed against a conventional printing roll having a secondary pattern intended to be complimentary for a particular end use to the predetermined pattern. Although the virtually invisible, the position of the first predetermined pattern is known through the visible fiducial marks. A secondary pattern is then applied to the web through, e.g. printing or laminating. The web is the conveniently steered into an appropriate registration between the first predetermined pattern and the secondary pattern using, e.g. the techniques of PCT International Pub. No. WO 2013/090134.

Other modifications and variations to the present disclosure may be practiced by those of ordinary skill in the art, without departing from the spirit and scope of the present disclosure, which is more particularly set forth in the appended claims. It is understood that aspects of the various embodiments may be interchanged in whole or part or combined with other aspects of the various embodiments. All cited references, patents, or patent applications in the above application for letters patent are herein incorporated by reference in their entirety in a consistent manner. In the event of inconsistencies or contradictions between portions of the incorporated references and this application, the information in the preceding description shall control. The preceding description, given in order to enable one of ordinary skill in the art to practice the claimed disclosure, is not to be construed as limiting the scope of the disclosure, which is defined by the claims and all equivalents thereto.

The invention claimed is:

1. A method of providing a substrate having a predetermined pattern thereon comprising:
    providing a printing roll, a first ink dispenser, and a second ink dispenser, the first ink dispenser and the second ink dispenser positioned to dispense a first and a second ink onto the printing roll in separate first and second zones respectively;
    dispensing a low contrast ink into the first zone and a visible ink into the second zone;
    advancing the substrate against the printing roll to print fiducial marks onto the substrate with the visible ink, while simultaneously printing a first predetermined pattern onto the substrate with the low-contrast ink;
    subsequently placing a secondary pattern in registration with the first predetermined pattern on the substrate using the fiducial marks as a guide.

TABLE 1

| Magnification of the camera objective | Minimum aperture | Maximum aperture | $R_s$ | $R_i$ | $C_c$ | $C_a$ | $C_b$ |
|---|---|---|---|---|---|---|---|
| 5X | 0.15° | 8.6° | 28689 | 24877 | 1.1532 | 0.1532 | 0.1423 |
| 10X | 0.30° | 17.5° | 30244 | 29130 | 1.0382 | 0.0382 | 0.0375 |
| 20X | 0.50° | 30.0° | 25746 | 26735 | 0.9630 | −0.0370 | −0.0377 |

2. The method according to claim 1 wherein the printing roll is a roll selected from the group consisting of flexographic, gravure, dual offset and anilox rolls, at least in the first zone.

3. The method according to claim 1 wherein the predetermined pattern includes features having a dimension less than 20 microns in size.

4. The method according to claim 1 wherein the fiducial marks and the first predetermined pattern are in registration with a dimensional accuracy of less than 20 microns.

* * * * *

UNITED STATES PATENT AND TRADEMARK OFFICE
CERTIFICATE OF CORRECTION

PATENT NO. : 9,556,510 B2      Page 1 of 1
APPLICATION NO. : 15/076236
DATED : January 31, 2017
INVENTOR(S) : Mikhail Pekurovsky It is certified that error appears in the above-identified patent and that said Letters Patent is hereby corrected as shown below:

In the Specification

Column 4
Line 54, Delete "1250B" and insert -- I250B --, therefor.

Column 5
Line 31, Delete "1250B" and insert -- I250B --, therefor.
Line 55 (approx.), Delete "$C_b=(R_s-R_i)/((R_s+R_2)/2)$." and insert -- $C_b=(R_s-R_i)/((R_s+R_i)/2)$. --, therefor.

Signed and Sealed this
Twentieth Day of June, 2017

Joseph Matal
*Performing the Functions and Duties of the
Under Secretary of Commerce for Intellectual Property and
Director of the United States Patent and Trademark Office*